United States Patent
Singh et al.

(10) Patent No.: US 11,048,164 B2
(45) Date of Patent: Jun. 29, 2021

(54) CONFIGURING OPTICAL LAYERS IN IMPRINT LITHOGRAPHY PROCESSES

(71) Applicant: Molecular Imprints, Inc., Austin, TX (US)

(72) Inventors: Vikramjit Singh, Pflugerville, TX (US); Michael Nevin Miller, Austin, TX (US); Frank Y. Xu, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 16/934,226

(22) Filed: Jul. 21, 2020

(65) Prior Publication Data

US 2020/0348589 A1    Nov. 5, 2020

Related U.S. Application Data

(62) Division of application No. 15/704,129, filed on Sep. 14, 2017, now Pat. No. 10,747,107.

(60) Provisional application No. 62/429,214, filed on Dec. 2, 2016.

(51) Int. Cl.
| | |
|---|---|
| *G02B 1/118* | (2015.01) |
| *G03F 7/00* | (2006.01) |
| *B29C 33/42* | (2006.01) |
| *B29C 59/02* | (2006.01) |
| *B29C 59/16* | (2006.01) |
| *G03F 9/00* | (2006.01) |

(52) U.S. Cl.
CPC .......... *G03F 7/0002* (2013.01); *B29C 33/424* (2013.01); *B29C 59/022* (2013.01); *B29C 59/16* (2013.01); *G03F 7/0015* (2013.01); *G03F 9/7053* (2013.01)

(58) Field of Classification Search
CPC .............................. G02B 1/118; G03F 7/0002
See application file for complete search history.

(56) References Cited

U.S. PATENT DOCUMENTS

| | | | |
|---|---|---|---|
| 6,396,559 B1 | 5/2002 | Kishimoto et al. | |
| 8,427,747 B2 | 4/2013 | Le et al. | |
| 10,747,107 B2 | 8/2020 | Singh et al. | |
| 2007/0159698 A1* | 7/2007 | Taguchi | G02B 5/045 359/586 |

(Continued)

FOREIGN PATENT DOCUMENTS

| | | |
|---|---|---|
| JP | 2015-049376 A | 3/2015 |
| JP | 2015-513797 A | 5/2015 |
| JP | 2016-114770 A | 6/2016 |

OTHER PUBLICATIONS

JP Office Action in Japanese Appln. No. 2019-529208, dated Jan. 21, 2021, 6 pages (with English translation).

(Continued)

*Primary Examiner* — Scott W Dodds
(74) *Attorney, Agent, or Firm* — Fish & Richardson P.C.

(57) ABSTRACT

An imprint lithography method of configuring an optical layer includes imprinting first features of a first order of magnitude in size on a side of a substrate with a patterning template, while imprinting second features of a second order of magnitude in size on the side of the substrate with the patterning template, the second features being sized and arranged to define a gap between the substrate and an adjacent surface.

20 Claims, 9 Drawing Sheets

(56) References Cited

U.S. PATENT DOCUMENTS

| | | | |
|---|---|---|---|
| 2007/0178666 A1 | 8/2007 | Do et al. | |
| 2009/0256287 A1 | 10/2009 | Fu et al. | |
| 2010/0052216 A1 | 3/2010 | Kim et al. | |
| 2010/0165134 A1 | 7/2010 | Dowski, Jr. et al. | |
| 2010/0201042 A1 | 8/2010 | Sreenivasan et al. | |
| 2011/0049761 A1 | 3/2011 | Mataki | |
| 2011/0304851 A1 | 12/2011 | Coene et al. | |
| 2012/0200932 A1 | 8/2012 | Minari et al. | |
| 2013/0052414 A1 | 2/2013 | Dobbins et al. | |
| 2013/0203193 A1 | 8/2013 | Kang et al. | |
| 2013/0214452 A1 | 8/2013 | Choi et al. | |
| 2016/0042507 A1 | 2/2016 | Turner | |
| 2016/0116739 A1 | 4/2016 | TeKolste et al. | |
| 2016/0139328 A1 | 5/2016 | Hikmet et al. | |
| 2016/0216416 A1 | 7/2016 | TeKolste et al. | |
| 2016/0313494 A1* | 10/2016 | Hamilton | G02B 5/0294 |
| 2017/0235142 A1* | 8/2017 | Wall | G02B 5/26 |
| | | | 359/633 |
| 2018/0157170 A1 | 6/2018 | Singh et al. | |

OTHER PUBLICATIONS

EPO Extended European Search Report in European Appln. No. 17877037.6, dated Oct. 31, 2019, 7 pages.

PCT International Search Report and the Written Opinion for Application No. PCT/US2017/051444, dated Nov. 16, 2017, 14 pages.

\* cited by examiner

CONFIGURING OPTICAL LAYERS IN IMPRINT LITHOGRAPHY PROCESSES

CROSS-REFERENCE TO RELATED APPLICATION

This application is a divisional of U.S. application Ser. No. 15/704,129, filed on Sep. 14, 2017, which claims the benefit of the filing date of U.S. Provisional Application No. 62/429,214, filed on Dec. 2, 2016. The contents of U.S. application Ser. No. 15/704,129 and U.S. Application No. 62/429,214 are incorporated herein by reference in their entirety.

TECHNICAL FIELD

This invention relates to configuring optical layers in imprint lithography processes, and more particularly to forming features of different orders of magnitude in size on a substrate in one processing step.

BACKGROUND

Nanofabrication (e.g., nanoimprint lithography) can include the fabrication of very small structures that have features on the order of 100 nanometers or smaller. One application in which nanofabrication has had a significant impact is in the processing of integrated circuits. The semiconductor processing industry continues to strive for larger production yields, while increasing a number of circuits formed on a substrate per unit area of the substrate. To this end, nanofabrication has become increasingly important to achieving desired results in the semiconductor processing industry. Nanofabrication provides greater process control while allowing continued reduction of minimum feature dimensions of structures formed on substrates. Other areas of development in which nanofabrication has been employed include biotechnology, optical technology, mechanical systems, and the like. In some examples, nanofabrication includes fabricating structures on substrates that are assembled to form an optical device.

SUMMARY

The invention involves a realization that improvements in imprinting three-dimensional (3D) patterns on substrates can increase an accuracy and a precision, while reducing a cost and a complexity associated with producing such patterns. Conventional imprint lithography processes may include imprinting a nano-scale pattern on a substrate in a first step and subsequently imprinting features of a larger order of magnitude on the substrate in a second, subsequent step. For such processes, cleaning and treating of the nano-scale pattern may be required prior to forming the larger features, which is associated with additional costs and additional time. Furthermore, aspects of forming the larger features in the subsequent step can sometimes jeopardize a mechanical integrity and/or a functional integrity of the nano-patterned substrate. In this regard, various aspects of disclosed imprint lithography methods can allow imprinting of 3D structures with features that have different orders of magnitudes with multiple functions (e.g., any of optical functions, anti-reflective, and spacing) in a single imprinting step. Such methods yield precise, accurate structures at a reduced cost and duration, as compared to alternative methods.

One aspect of the invention features an imprint lithography method of configuring an optical layer. The imprint lithography method includes imprinting first features of a first order of magnitude in size on a side of a substrate with a patterning template, while imprinting second features of a second order of magnitude in size on the side of the substrate with the patterning template, wherein the second features are sized and arranged to define a gap between the substrate and an adjacent surface.

In some embodiments, imprinting the first features includes forming one or both of diffraction gratings and anti-reflective features on the side of the substrate.

In certain embodiments, imprinting the second features includes forming spacers on the side of the substrate.

In some embodiments, the method further includes imprinting one or both of the spacers and the anti-reflective features along a peripheral edge of the side of the substrate.

In certain embodiments, the method further includes imprinting one or both of the spacers and the anti-reflective features within an interior region of the side of the substrate.

In some embodiments, the side of the substrate is a first side of the substrate, and the imprint lithography method further includes imprinting third features of the first order of magnitude in size on a second side of the substrate.

In certain embodiments, imprinting the third features includes forming diffraction gratings or anti-reflective features on the second side of the substrate.

In some embodiments, the second order of magnitude in size is greater than the first order of magnitude in size.

In certain embodiments, the first order of magnitude in size is of a nano-scale, and the second order of magnitude in size is of a micro-scale.

In some embodiments, the method further includes imprinting the second features on opposite sides of the first features.

In certain embodiments, the method further includes creating the patterning template from a predecessor mold.

In some embodiments, the method further includes forming deep features of the second order of magnitude in size in the predecessor mold.

In certain embodiments, the method further includes forming shallow features of the first order of magnitude in size in the predecessor mold.

In some embodiments, the substrate is a first substrate, and the adjacent surface is defined by a second substrate.

In certain embodiments, the method further includes aligning the first and second substrates with each other.

In some embodiments, the method further includes dispensing an adhesive substance atop the second features imprinted on the side of the first substrate.

In certain embodiments, the method further includes attaching the first and second substrates to each other at the adhesive substance atop the second features imprinted on the side of the first substrate to form the gap between the first substrate and the adjacent surface defined by the second substrate.

In some embodiments, the method further includes attaching the first and second substrates to each other at the adhesive substance atop the second features imprinted on the side of the first substrate to form a multi-layer optical device.

In certain embodiments, the method further includes defining a layer of air between the first and second substrates with a thickness that is determined by heights of the second features.

In some embodiments, the gap provides a low index region.

In certain embodiments, the low index region is air with an index of refraction of 1.

In some embodiments, the imprint lithography method further includes providing the multi-layer optical device with layers characterized by alternating indexes of refraction.

Another aspect of the invention features an optical layer that includes a substrate and a pattern imprinted on a side of the substrate with a patterning template. The pattern includes first features of a first order of magnitude in size and second features of a second order of magnitude in size. The second features are sized and arranged to define a gap between the substrate and an adjacent surface.

The details of one or more embodiments of the invention are set forth in the accompanying drawings and the description below. Other features, aspects, and advantages of the invention will be apparent from the description, the drawings, and the claims.

BRIEF DESCRIPTION OF THE DRAWINGS

Like reference symbols in the various figures indicate like elements.

Figure 1:
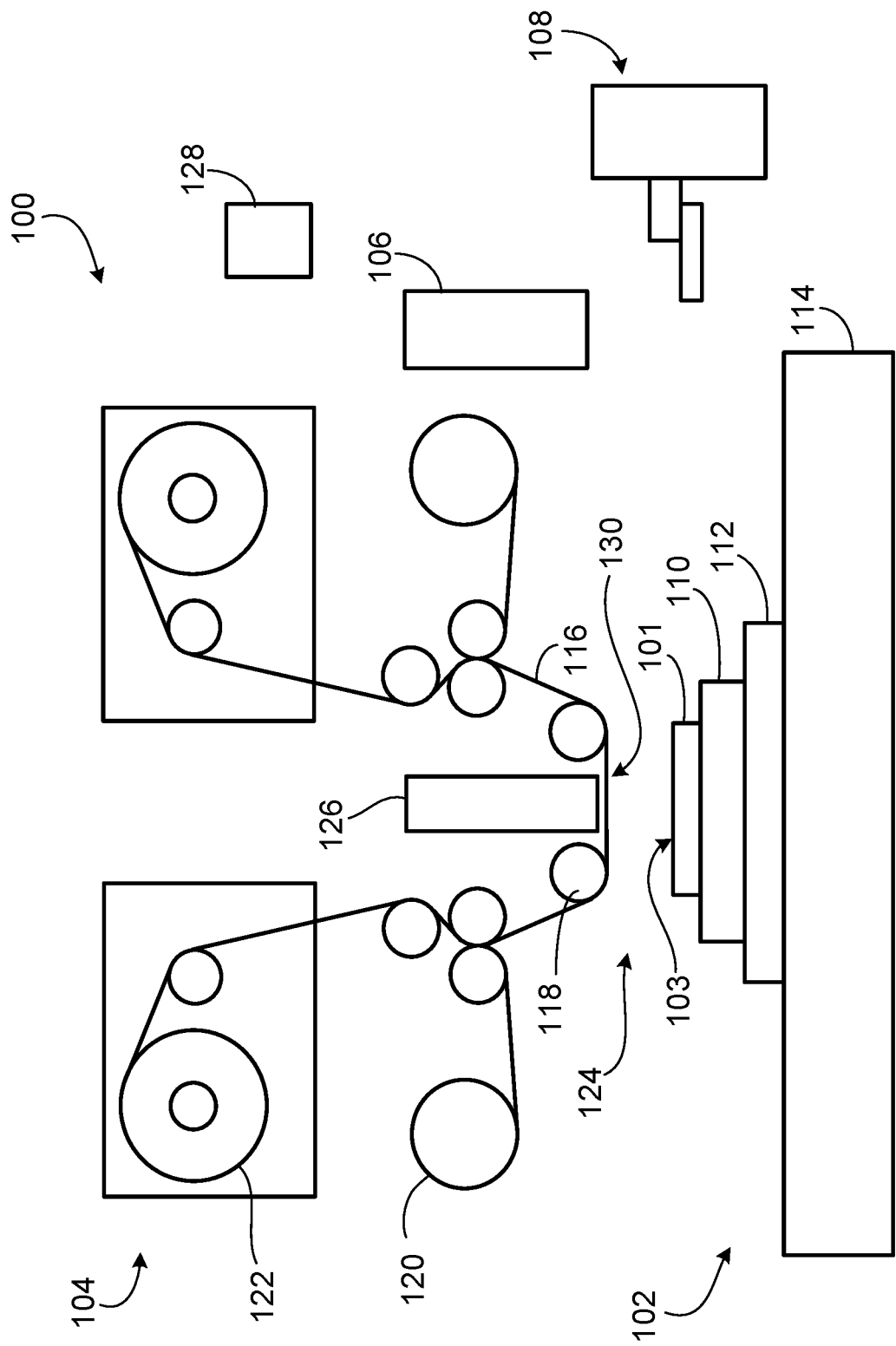
FIG. 1 is a diagram of an imprint lithography system.

In some examples, illustrations shown in the drawings may not be drawn to scale.

DETAILED DESCRIPTION

An imprint lithography process for configuring an optical layer is described below. The imprint lithography process involves imprinting a multi-functional structure including features of different orders of magnitude from a single template. Such a process can improve a precision and an accuracy and reduce a cost and a complexity associated with producing such structures for creating multi-layer optical devices.

FIG. 1 illustrates an imprint lithography system 100 that is operable to form a relief pattern on a top surface 103 of a substrate 101 (e.g., a wafer). The imprint lithography system 100 includes a support assembly 102 that supports and transports the substrate 101, an imprinting assembly 104 that forms the relief pattern on the top surface 103 of the substrate 101, a fluid dispenser 106 that deposits a polymerizable substance upon the top surface 103 of the substrate 101, and a robot 108 that places the substrate 101 on the support assembly 102. The imprint lithography system 100 also includes one or more processors 128 that can operate on a computer readable program stored in memory and that are in communication with and programmed to control the support assembly 102, the imprinting assembly 104, the fluid dispenser 106, and the robot 108.

The substrate 101 is a substantially planar, thin slice that is typically made of one or more materials including silicon, silicon dioxide, aluminum oxide, sapphire, germanium, gallium arsenide (GaAs), an alloy of silicon and germanium, indium phosphide (InP), or other example materials. The substrate 101 typically has a substantially circular or rectangular shape. The substrate 101 typically has a diameter in a range of about 50 mm to about 200 mm (e.g., about 65 mm, about 150 mm, or about 200 mm) or a length and a width in a range of about 50 mm to about 200 mm (e.g., about 65 mm, about 150 mm, or about 200 mm). The substrate 101 typically has and a thickness in a range of about 0.2 mm to about 1.0 mm. The thickness of the substrate 101 is substantially uniform (e.g., constant) across the substrate 101. The relief pattern is formed as a set of structural features (e.g., protrusions and suction structures) in the polymerizable substance upon the top surface 103 of the substrate 101, as will be discussed in more detail below.

The support assembly 102 includes a chuck 110 that supports and secures the substrate 101, an air bearing 112 that supports the chuck 110, and a base 114 that supports the air bearing 112. The base 114 is located in a fixed position, while the air bearing 112 can move in up to three directions (e.g., x, y, and z directions) to transport the chuck 110 (e.g., in some instances, carrying the substrate 101) to and from the robot 108, the fluid dispenser 106, and the imprinting assembly 104. In some embodiments, the chuck 110 is a vacuum chuck, a pin-type chuck, a groove-type chuck, an electromagnetic chuck, or another type of chuck.

Still referring to FIG. 1, the imprinting assembly 104 includes a flexible template 116 with a patterning surface defining an original pattern from which the relief pattern is formed complementarily on the top surface 103 of the substrate 101. Accordingly, the patterning surface of the flexible template 116 includes structural features such as protrusions and recesses. The imprinting assembly 104 also includes multiple rollers 118, 120, 122 of various diameters that rotate to allow one or more portions of the flexible template 116 to be moved in the x direction within a processing region 130 of the imprint lithography system 100 to cause a selected portion of the flexible template 116 to be aligned (e.g., superimposed) with the substrate 101 along the processing region 130. One or more of the rollers 118, 120, 122 are individually or together moveable in the vertical direction (e.g., the z direction) to vary a vertical position of the flexible template 116 in the processing region 130 of the imprinting assembly 104. Accordingly, the flexible template 116 can push down on the substrate 101 in the processing region 130 to form an imprint atop the substrate 101. An arrangement and a number of the rollers 118, 120, 122 can vary, depending upon various design parameters of the imprint lithography system 100. In some embodiments, the flexible template 116 is coupled to (e.g., supported or secured by) a vacuum chuck, a pin-type chuck, a groove-type chuck, an electromagnetic chuck, or another type of chuck.

In operation of the imprint lithography system 100, the flexible template 116 and the substrate 101 are aligned in desired vertical and lateral positions by the rollers 118, 120, 122 and the air bearing 112, respectively. Such positioning defines a volume 124 within the processing region 130 between the flexible template 116 and the substrate 101. The volume 124 can be filled by the polymerizable substance once the polymerizable substance is deposited upon the top surface 103 of the substrate 101 by the fluid dispenser 106, and the chuck 110 (e.g., carrying the substrate 101) is subsequently moved to the processing region 130 by the air bearing 112. Accordingly, both the flexible template 116 and the top surface 103 of the substrate 101 can be in contact with the polymerizable substance in the processing region 130 of the imprint lithography system 100. Example polymerizable substances may be formulated from one or more substances, such as isobornyl acrylate, n-hexyl acrylate, ethylene glycol diacrylate, 2-hydroxy-2-methyl-1-phenyl-propan-1-one, (2-Methyl-2-Ethyl-1,3-dioxolane-4-yl) methyl acrylate, hexanediol diacrylate, 2-methyl-1-[4-(methylthio)phenyl]-2-(4-morpholinyl)-1-propanone, diphenyl (2,4,6-trimethylbenzoyl)-phosphine oxide, 2-hydroxy-2-methyl-1-phenyl-1-propanone, and various surfactants. Example techniques by which the polymerizable substance may be deposited atop the substrate 101 by the fluid dispenser 106 include drop dispense, spin-coating, dip coating, chemical vapor deposition (CVD), physical vapor deposition (PVD), thin film deposition, thick film deposition, and other techniques. In some examples, the polymerizable substance is deposited atop the substrate 101 in multiple droplets.

The printing system 104 includes an energy source 126 that directs energy (e.g., broadband ultraviolet radiation) towards the polymerizable substance atop the substrate 101 within the processing region 130. Energy emitted from the energy source 126 causes the polymerizable substance to solidify and/or cross-link, thereby resulting in a patterned layer that conforms to a shape of the portion of the flexible template 116 in contact with the polymerizable substance in the processing region 130.

Figure 2:
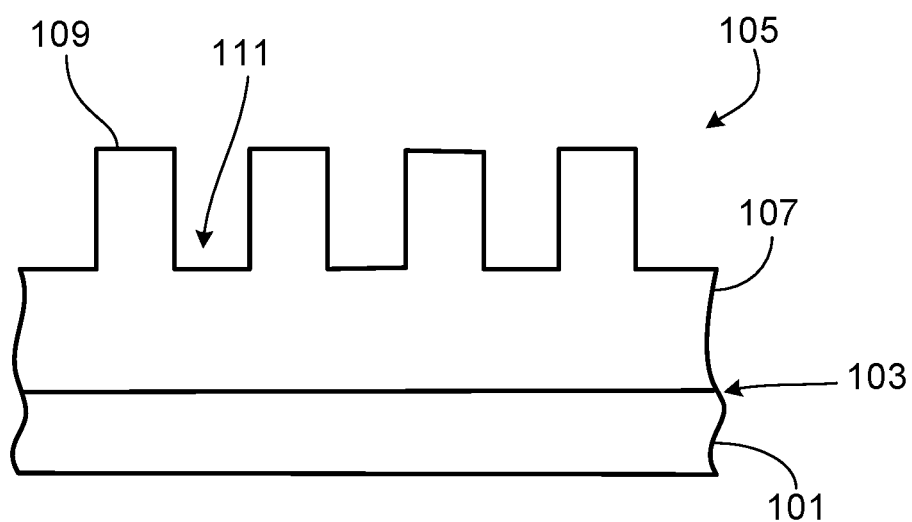
FIG. 2 is diagram of patterned layer formed by the imprint lithography system of FIG. 1.

FIG. 2 illustrates an example patterned layer 105 formed on the substrate 101 by the imprint lithography system 100. The patterned layer 105 includes a residual layer 107 and multiple features including protrusions 109 extending from the residual layer 107 and recessions 111 formed by adjacent protrusions 109 and the residual layer 107.

While the imprint lithography system 100 is described and illustrated as a roll-to-plate or plate-to-roll system, imprint lithography systems of a different configurations can also be used to produce the example patterned layer 105 and the example patterns discussed below. Such imprint lithography systems may have a roll-to-roll or a plate-to-plate configuration.

Figure 3:
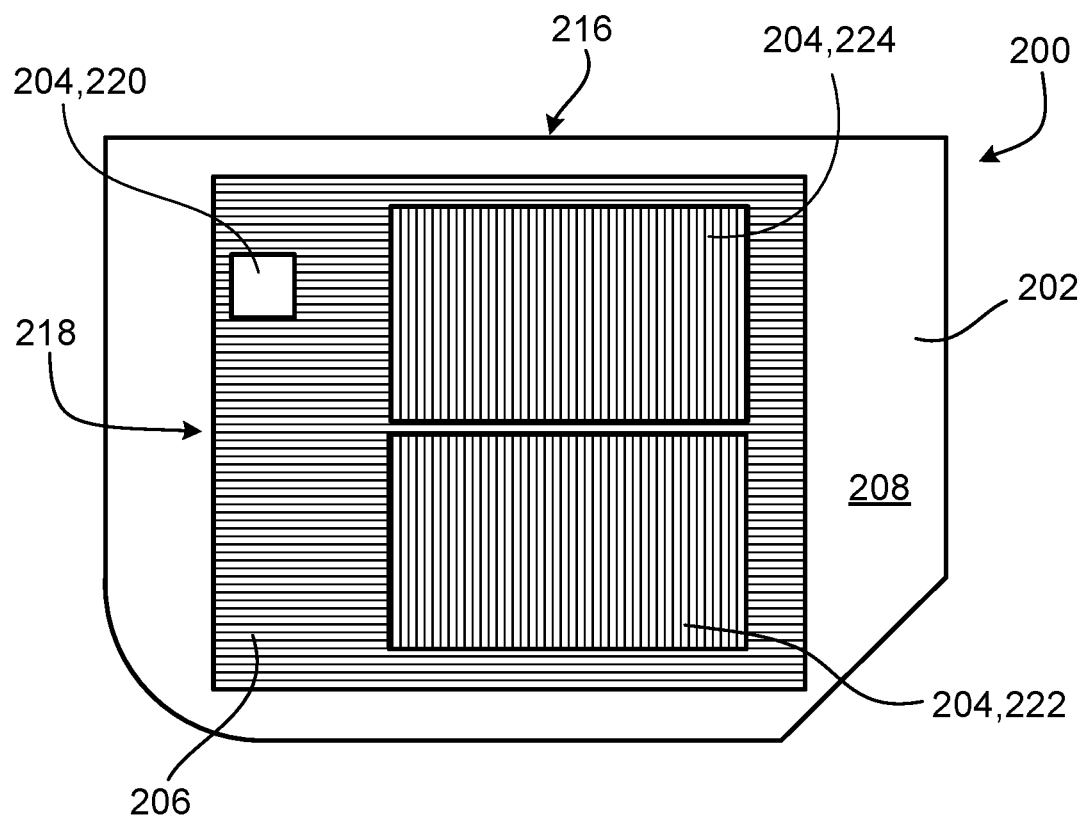
FIG. 3 is a top view of an optical layer.
Figure 4:
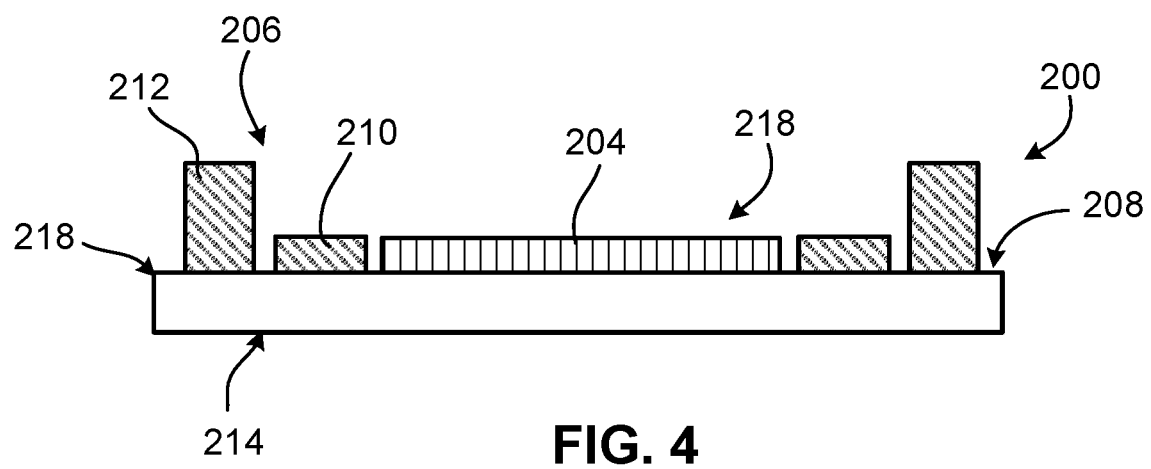
FIG. 4 is a side view of the optical layer of FIG. 3.

In some embodiments, a substrate (e.g., the substrate 101 of the imprint lithography system 100) is processed (e.g., imprinted on one or both sides and cut out to shape) to form an optical layer of a multi-layer optical device (e.g., a wearable eyepiece, an optical sensor, or an optical film, such as that used in a display). For example, FIGS. 3 and 4 illustrate a top view and a side view, respectively, of an optical layer 200 that includes a substrate 202, a functional pattern 204 imprinted on the substrate 202, and an auxiliary pattern 206 imprinted on the substrate 202. The substrate 202 may be laser cut from a larger substrate (e.g., the substrate 101) and is provided as a layer of transparent or semi-transparent plastic (e.g., flexible) or glass (e.g., rigid) that is made of one or more organic or inorganic materials, in accordance with the various material formulations described above with respect to the substrate 101. The substrate 202 has a maximum length of about 10 mm to about 500 mm and a maximum width of about 10 mm to about 500 mm. The substrate 202 has a relatively high refractive index in a range of about 1.6 to about 1.9 and a transmissivity in a range of about 80% to about 95%.

The functional pattern 204 is imprinted atop an upper side 208 of the substrate 202 and is located along an interior region 218 with respect to a peripheral edge 216 of the substrate 202. The functional pattern 204 is a waveguide pattern formed of multiple diffraction gratings that provide a basic working functionality of the optical layer 200. The diffraction gratings have dimensions in a range of about 10 nm to about 500 nm. The diffraction gratings are configured to project light of wavelengths within a particular range and to focus a virtual image at a particular depth plane. The focused light, together with focused light projected through proximal optical layers, forms a multi-color virtual image over one or more depth planes. The transmitted light may be red light with wavelengths in a range of about 560 nm to about 640 nm, green light with wavelengths in a range of about 490 nm to about 570 nm, or blue light with wavelengths in a range of about 390 nm to about 470 nm. The diffraction gratings can include multiple combinations and arrangements of protrusions and recessions (e.g., such as the protrusions 109 and the recessions 111) that together provide desired optical effects. The diffraction gratings include in-coupling gratings 220 and form an orthogonal pupil expander region 222 and an exit pupil expander region 224. The functional pattern 204 has a total length of about 10 mm to about 500 mm and a total width of about 10 mm to about 500 mm.

The auxiliary pattern 206 is imprinted atop the upper side 208 of the substrate 202 and surrounds the functional pattern 204. The auxiliary pattern 206 is also co-located with the interior region 218 of the substrate 202. The auxiliary pattern 206 includes both anti-reflective features 210 of a nano-scale and spacers 212 of a micro-scale that may be distributed in various quantities and arrangements across the auxiliary pattern 206. The auxiliary pattern 206 coincides with the interior region 218 of the substrate 202 and has a total length of about 10 mm to about 500 mm and a total width of about 10 mm to about 500 mm.

The anti-reflective features 210 may be arranged anywhere within the auxiliary pattern 206. The anti-reflective features 210 are sized (e.g., having a height of less than or equal to about 300 nm and a pitch of about 50 nm to about 150 nm) and shaped to reduce surface reflection at the side (e.g., the upper side 208) of the substrate 202 on which the anti-reflective features 210 are imprinted. For example, the anti-reflective features 210 may reduce the surface reflection of the substrate 202 by about 1.0% to about 4.5%. The anti-reflective features 210 are further sized and shaped to increase the transmissivity of the substrate 202 to greater than about 98.5% (e.g., for a plastic substrate 202) and up to about 99.5% (e.g., for a glass substrate 202). The anti-reflective features 210 are also sized and shaped to provide the substrate 202 with a new effective refractive index in a range of about 1.2 to about 1.4. Additionally, the anti-reflective features 210 can introduce birefringence to diminish or enhance refraction of certain light wavelengths transmitted through the substrate 202.

The spacers 212 are sized to produce a gap (e.g., a layer of air) between the optical layer 200 and an adjacent optical layer that together form a part of a multi-layer stacked optical device when the two optical layers are adhered to one another, as will be discussed in more detail below with respect to FIGS. 7 and 8. The spacers 212 may be arranged anywhere within the auxiliary pattern 206 as necessary to provide adequate structural support for the substrate 202 and for an adjacent optical layer that is in contact with the spacers 212. In some embodiments, the spacers 212 (e.g., in a cured state) have a modulus of elasticity that is greater than 1 GPa. The spacers 212 can be imprinted in a pre-defined geometry (e.g., tetrahedral, cylindrical, conical, etc.) and therefore may have a cross-sectional shape that is circular, rectangular, etc. The spacers 212 may have a lateral dimension (e.g., a width or a diameter) in a range of about 1 μm to about 100 μm and a vertical dimension (e.g., a height) of about 1 μm to about 50 μm. Each spacer 212 may be located about 5 μm to about 100 μm from another adjacent spacer 212, from an anti-reflective feature 210, or from a diffraction grating of the functional pattern 204.

Figure 5:
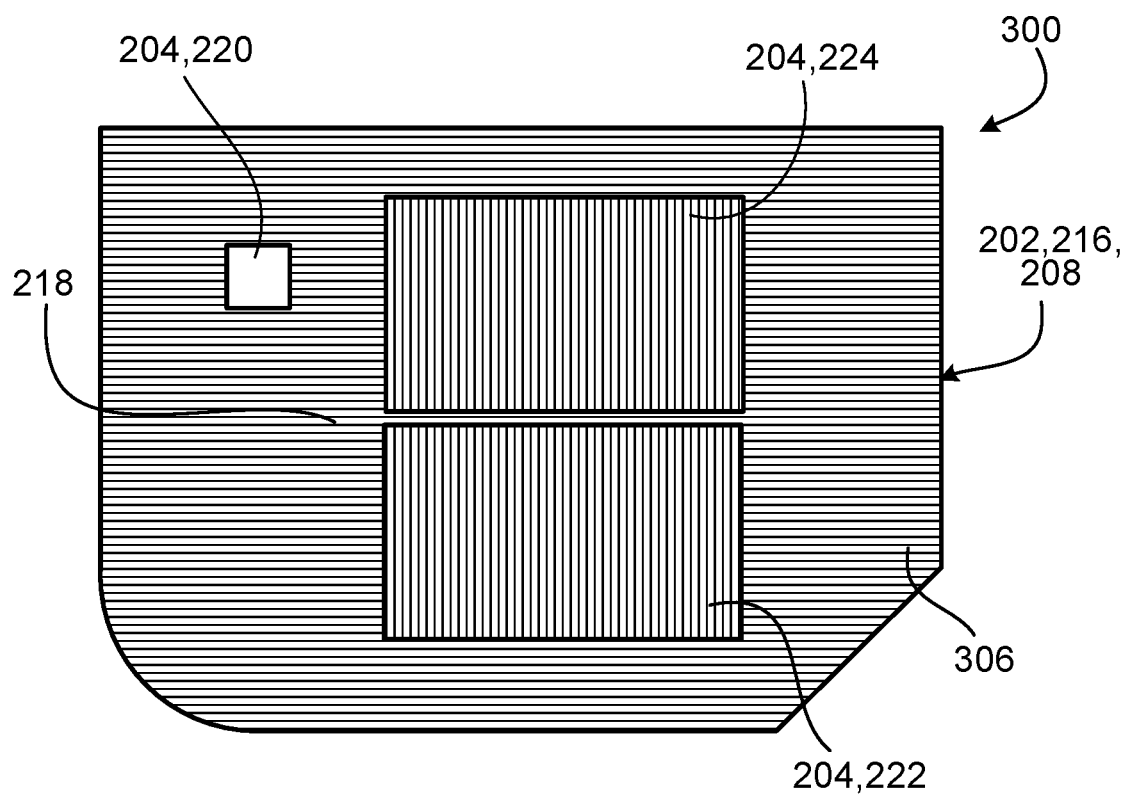
FIG. 5 is a top view of an optical layer with a configuration that is different from the configuration of the optical layer shown in FIG. 3.

Other arrangements of functional patterns and auxiliary patterns are possible. For example, FIG. 5 illustrates a top view of an optical layer 300 that includes the substrate 202 and the functional pattern 204 of the optical layer 200, as well as an auxiliary pattern 306. The functional pattern 204 is imprinted atop the upper layer 208 of the substrate 202, as in the optical layer 200. The auxiliary pattern 306 is also imprinted atop the upper layer 208 of the substrate 202 and is substantially similar in construction and function to the auxiliary pattern 206, except that the auxiliary pattern 306 extends across the interior region 218 to the peripheral edge 216 of the substrate 202.

Figure 6:
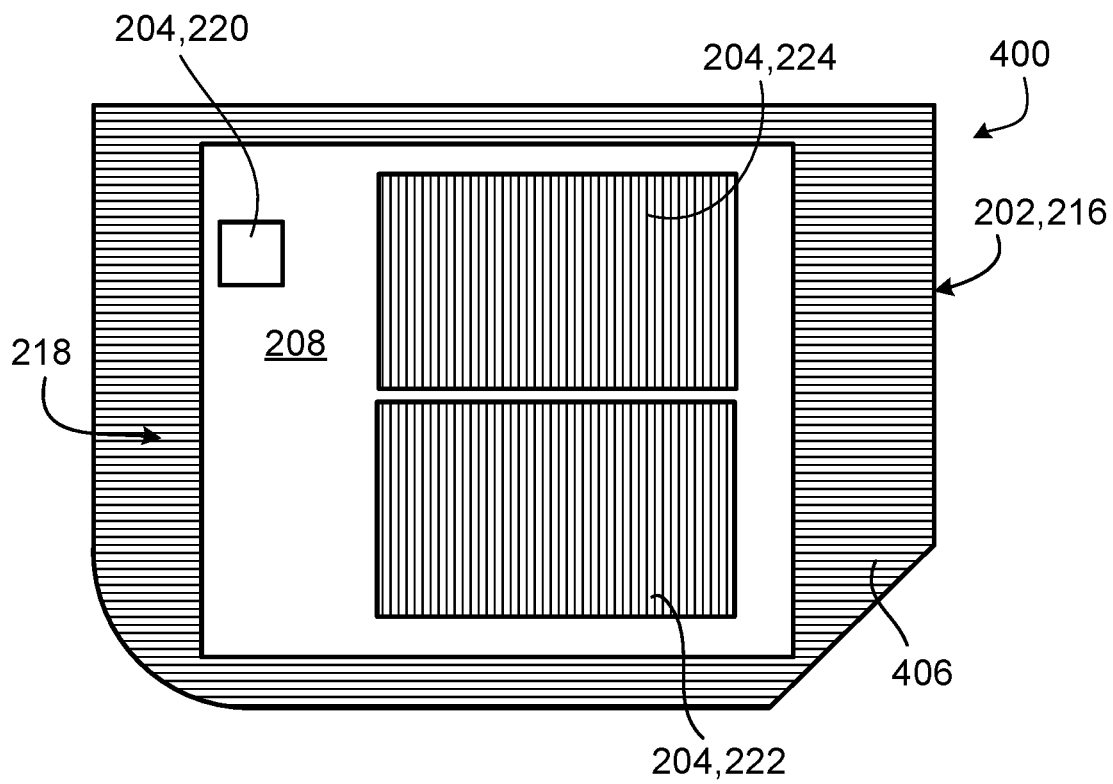
FIG. 6 is a top view of an optical layer with a configuration that is different from the configurations of the optical layers shown in FIGS. 3 and 5.

In another example embodiment, FIG. 6 illustrates a top view of an optical layer 400 that includes the substrate 202 and the functional pattern 204 of the optical layer 200, as well as an auxiliary pattern 406. The functional pattern 204 is imprinted atop the upper layer 208 of the substrate 202, as in the optical layer 200. The auxiliary pattern 406 is also imprinted atop the upper layer 208 of the substrate 202 and is substantially similar in construction and function to the auxiliary pattern 206, except that the auxiliary pattern 406 is imprinted along the peripheral edge 216 of the substrate 202, such that the interior region 218 of the substrate 202 remains non-patterned and surrounds the functional pattern 204. In other embodiments, optical layers may include functional patterns and auxiliary patterns with different shapes and/or arrangements not shown in the example optical layers 200, 300, 400.

Figure 7:
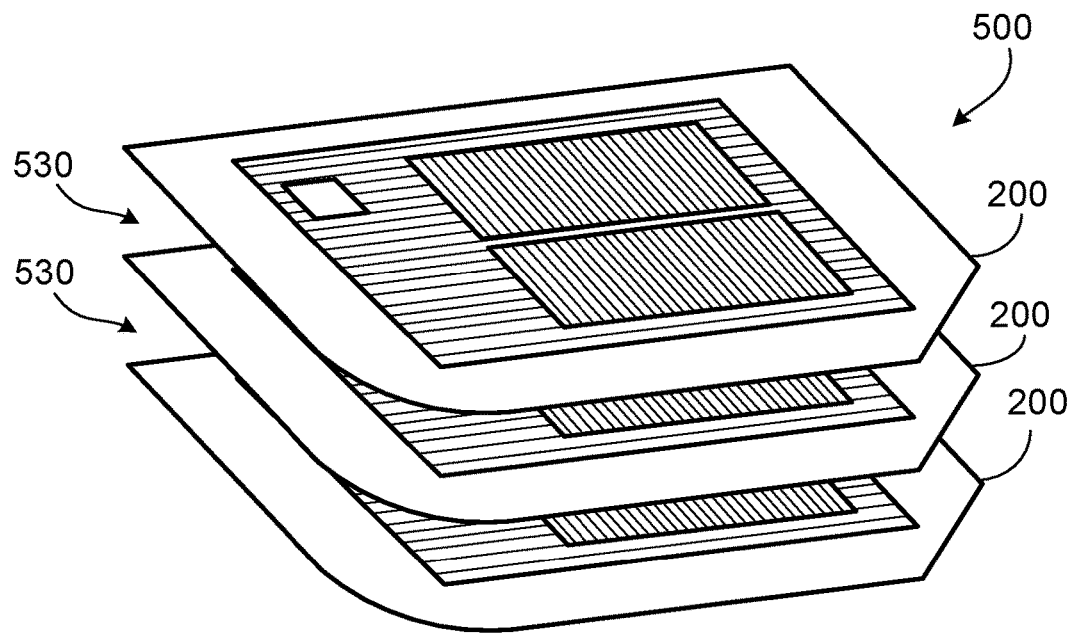
FIG. 7 is an exploded perspective view of a portion of an optical device that includes the optical layer of FIG. 3.

FIG. 7 illustrates an exploded perspective view of a portion of an optical device 500 (e.g., a wearable eyepiece) that includes multiple optical layers, including three of the example optical layers 200. FIG. 8 illustrates a (non-exploded) side view of the same portion of the optical device 500. The optical device 500 includes additional optical layers that are not shown. Referring to FIGS. 7 and 8, the optical device 500 is formed by aligning the optical layers 200 with one another and adhering the optical layers 200 to one another with adhesive drops dispensed atop the spacers 212. The optical layers 200 are subsequently further adhered to each other with a seal that serves as an attachment mechanism to which all of the peripheral edges 216 of the optical layers 200 are joined. The optical device 500 can include multiple of any of the optical layers 200, 300, 400, and other optical layers, and can include from 3 to 20 optical layers in total.

Figure 8:
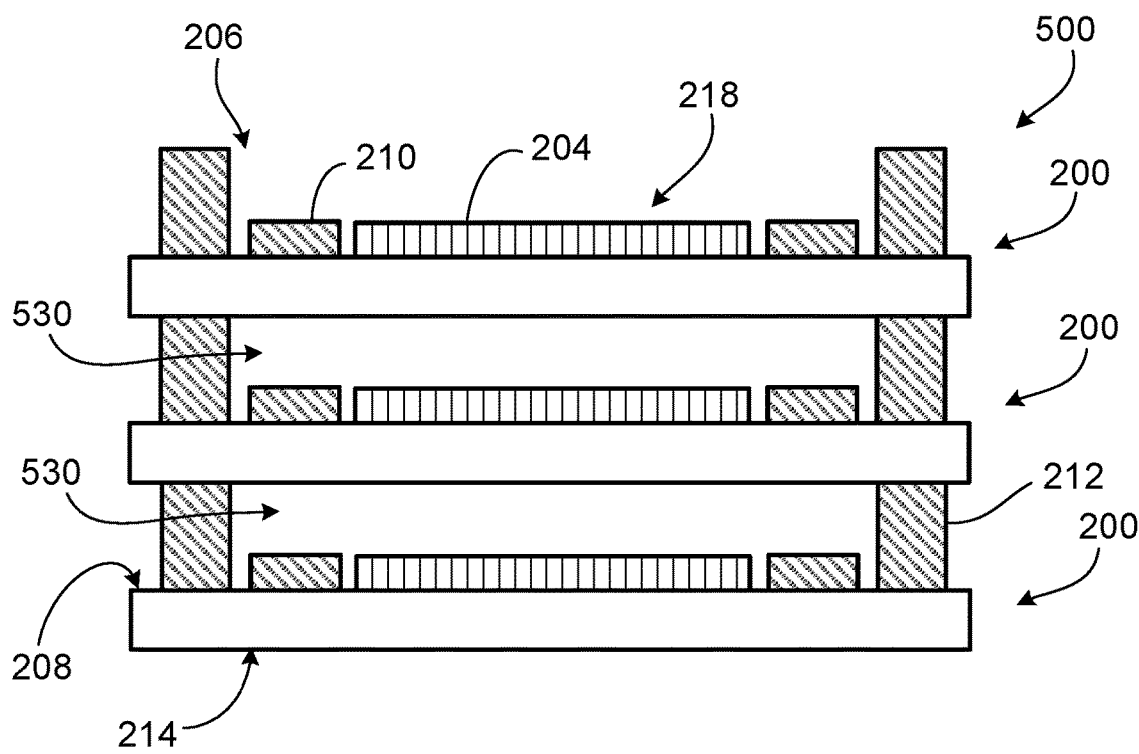
FIG. 8 is a side view of the portion of the optical device of FIG. 7.

For each optical layer 200 in the optical device 500, the spacers 212 together form a spacer layer that creates a gap 530 defining a layer of air between adjacent optical layers 200, as shown in FIG. 8. The layers of air defined by the spacers 212 have a low index of refraction in a range of about 1.0 to about 1.2. The low index layers of air, alternating with the high index optical layers 200, enhances 3D visualization and reduces or eliminates coupling of light between adjacent optical layers 200. The support structure formed by the arrangement of spacers 212 supports the substrate 202 on which the spacers 212 are imprinted and the adjacent substrate 202 in a way that prevents or reduces warping of the substrates 202 that may otherwise occur if the optical layers 200 were to be adhered via a different technique, such as dispensing drops of glue within interior portions or along the peripheral edges 216 of the substrates 202.

Figure 9:
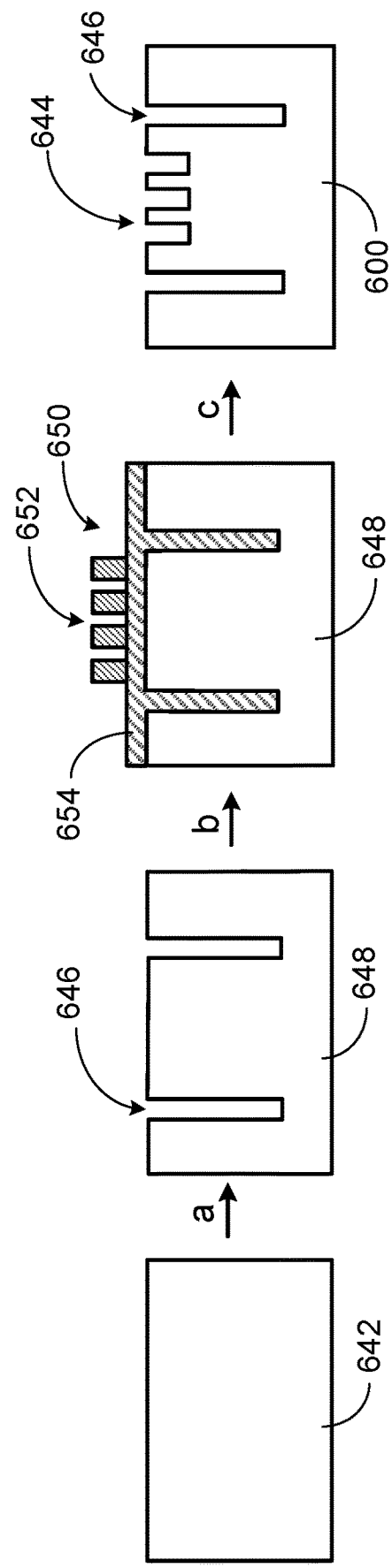
FIG. 9 is a diagram illustrating a series of steps for creating a patterning mold that can be used to produce the optical layer of FIG. 3.

FIG. 9 illustrates a series of steps for creating a patterning mold 600 (e.g., such as the patterning surface provided by the flexible template 116) from a predecessor mold 642 (e.g., a non-featured mold). The patterning mold 600 defines both shallow features 644 of a nano-scale and deep features 646 of a micro-scale. Accordingly, the shallow features 644 can be used to form the diffraction gratings of the functional pattern 204 and the anti-reflective features 210 of the auxiliary pattern 206 on the substrate 202, while the deep features 646 can be used to form the spacers 212 on the substrate 202 in a single imprinting step, as will be discussed in more detail below with respect to FIG. 14.

In a first step (a) for creating the patterning mold 600, the deep features 646 are formed in the predecessor mold 642 via a course method to create a micro-featured mold 648. Example course methods include lithography and reactive ion etching. In a next step (b), a polymerizable substance 650 is deposited atop the micro-featured mold 648 and patterned with fine features 652 of a nano-scale that project from a residual layer 654 in the manner as described above with respect to FIGS. 1 and 2. In a next step (c), the residual layer 654 is removed, and the fine features 652 are processed to form the shallow features 644 in the micro-featured mold 648 via plasma-based dry etching, reactive ion etching, or wet KOH etching of silicon to form the patterning mold 600. The spacers 212 produced with the deep features 646 of the patterning mold 600 are produced with an improved precision and accuracy as compared to spacer features that can be produced with other techniques that involve dispensing substances to form spacer features for adhering adjacent optical layers. In this regard, heights of the spacers 212 produced from the deep features 646 exhibit good co-planarity (e.g., to within a tolerance of +/−100 nm across a span of about 50 mm), and widths or diameters of the spacers 212 are consistent to within a +/−100 nm tolerance. As a result, the spacers 212 that are formed on the substrates 202 by the deep features 646 of the patterning mold 600 provide the spacer layers with an improved uniformity in thickness across single spacer layers such that adjacent substrates 202 can be aligned and oriented accurately and with reduced or eliminated warping. Additionally, an accuracy of the widths of the deep features 646 advantageously allows for improved structural integrity and functional integrity along the interior regions 218 of the substrates 202 according to use of the spacers 212, as compared to use of dispensed drops of glue, which tend to cause warping of substrates, sometimes lack sufficient adhesiveness, and tend to spread into functional patterns imprinted on the substrates. Furthermore, dispensed glue drops may span a relatively large area (e.g., about 500 μm in diameter) across a substrate with a spacer height of about 25 µm, whereas the spacers 212 may span a limited area (e.g., about 10 µm to about 20 µm in diameter) across a substrate with a spacer height of about 25 µm.

Figure 10:
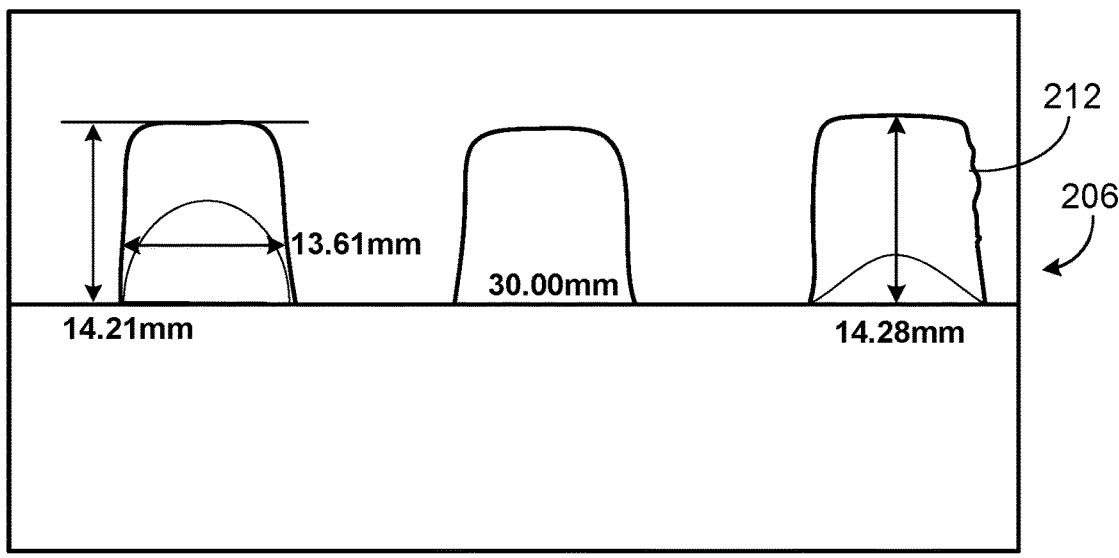
FIG. 10 is a side view of spacers formed with the patterning mold of FIG. 9.
Figure 11:
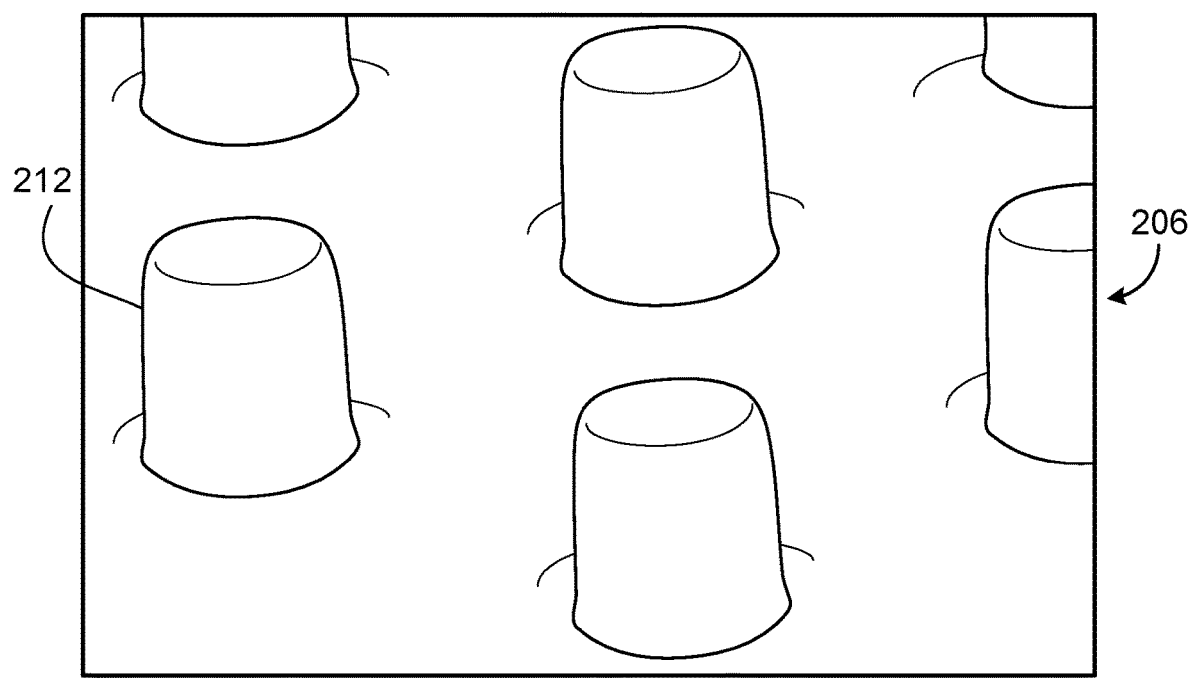
FIG. 11 is a perspective view of the spacers of FIG. 10.

FIGS. 10 and 11 respectively illustrate side and perspective views of spacers 212 of the auxiliary pattern 206 that are formed by the deep features 646 of the patterning mold 600. In the examples of FIGS. 10 and 11, the spacers 212 have a generally cylindrical shape and have features (e.g., heights and effective diameters) in a range of about 5 µm to about 100 µm.

Figure 12:
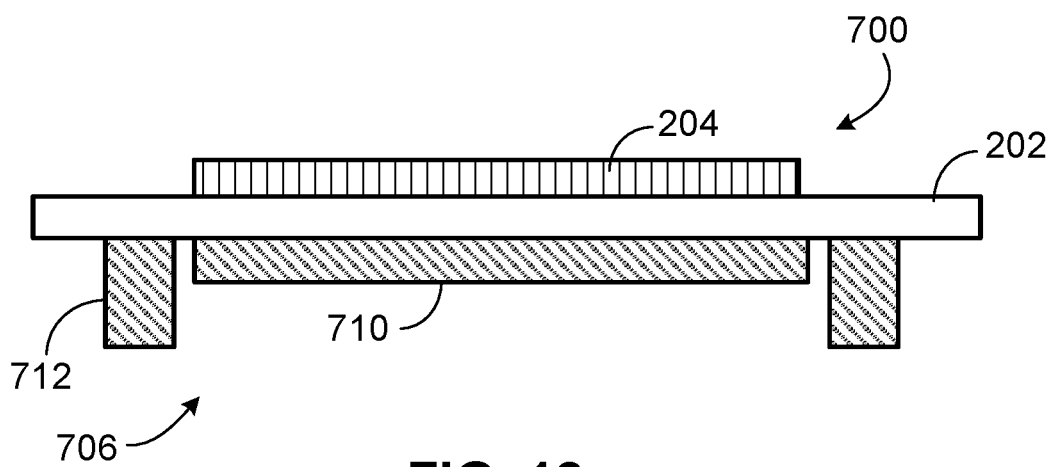
FIG. 12 is a side view of an optical layer with a configuration that is different from the configuration of the optical layer shown in FIGS. 3 and 4.

While the optical layer 200 has been described and illustrated as having the functional pattern 204 and the auxiliary pattern 206 imprinted on a single side (e.g., the upper side 208) of the substrate 202, other configurations are possible. For example, FIG. 12 illustrates a side view of an optical layer 700 that includes the substrate 202 and the functional pattern 204 of the optical layer 200 imprinted atop the upper side 208 of the substrate 202, as well as an auxiliary pattern 706 imprinted on the lower side 214 of the substrate 202. The auxiliary pattern 706 is substantially similar in construction and function to the auxiliary pattern 206, except that the auxiliary pattern 706 has a different size and shape than a size and a shape of the auxiliary pattern 206. For example, the auxiliary pattern 706 includes anti-reflective features 710 located opposite the functional pattern 204 and that span a width that is larger than a total width of a span of the anti-reflective features 210 of the auxiliary pattern 206. The auxiliary pattern 706 further includes spacers 712 located on opposite sides of the anti-reflective features 710. Owing to the functional pattern 204 and the auxiliary pattern 706 being located on opposite sides of the substrate 202, the functional pattern 204 and the auxiliary pattern 706 are patterned on the substrate 202 in separate imprinting steps, as opposed to being patterned in a single imprinting step, as is the case for the optical layer 200. Accordingly, a patterning mold with fine features and deep features that correspond to a configuration of the auxiliary pattern 706 can be created for forming the auxiliary pattern 706 in a manner similar to that described above with respect to the patterning mold 600. A separate patterning mold with fine features that correspond to a configuration of the functional pattern 204 can be created for forming the functional pattern 204.

Figure 13:
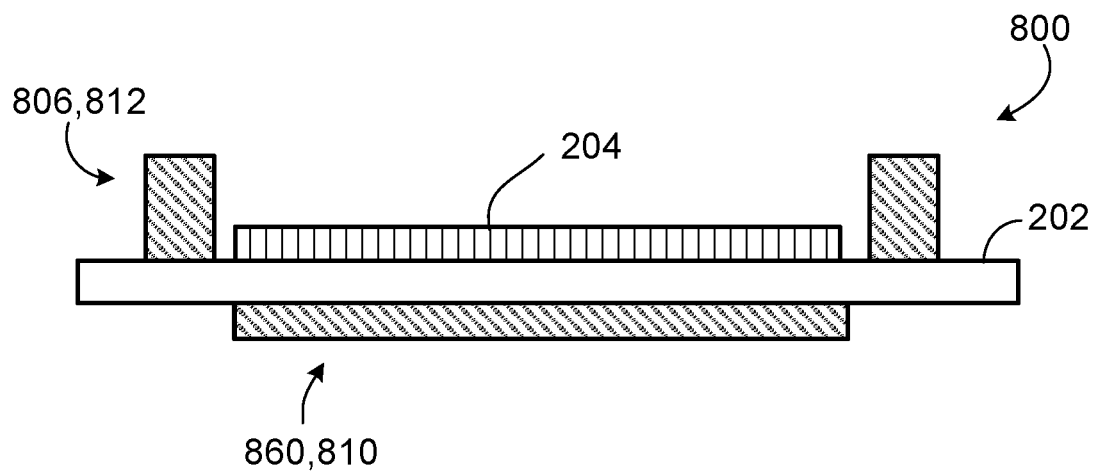
FIG. 13 is a side view of an optical layer with a configuration that is different from the configurations of the optical layers shown in FIGS. 3, 4, and 12.

In another example, FIG. 13 illustrates a side view of an optical layer 800 that includes the substrate 202 and the functional pattern 204 of the optical layer 200 imprinted atop the upper side 208 of the substrate 202, as well as a first auxiliary pattern 806 imprinted atop the upper side 208 of the substrate 202 and a second auxiliary pattern 860 imprinted on the lower side 214 of the substrate 202. For example, the first auxiliary pattern 806 includes spacers 812 located on opposite sides of the functional pattern 204. The second auxiliary pattern 860 includes anti-reflective features 810 located opposite the functional pattern 204. Accordingly, a patterning mold with fine features and deep features that correspond to a configuration of the functional pattern 204 and the first auxiliary pattern 806 can be created for forming the functional pattern 204 and the first auxiliary pattern 806 in a single imprinting step in a manner similar to that described above with respect to the patterning mold 600. A separate patterning mold with fine features that correspond to a configuration of the second auxiliary pattern 860 can be created for forming the second auxiliary pattern 860. Owing to the functional pattern 204 and the first auxiliary pattern 806 being located on a side of the substrate that is opposite a side the substrate 202 on which the second auxiliary pattern 860 is located, the functional pattern 204 and the first auxiliary pattern 806 are patterned on the substrate 202 together in one imprinting step, and the second auxiliary pattern 860 is patterned on the substrate 202 in another imprinting step.

Figure 14:
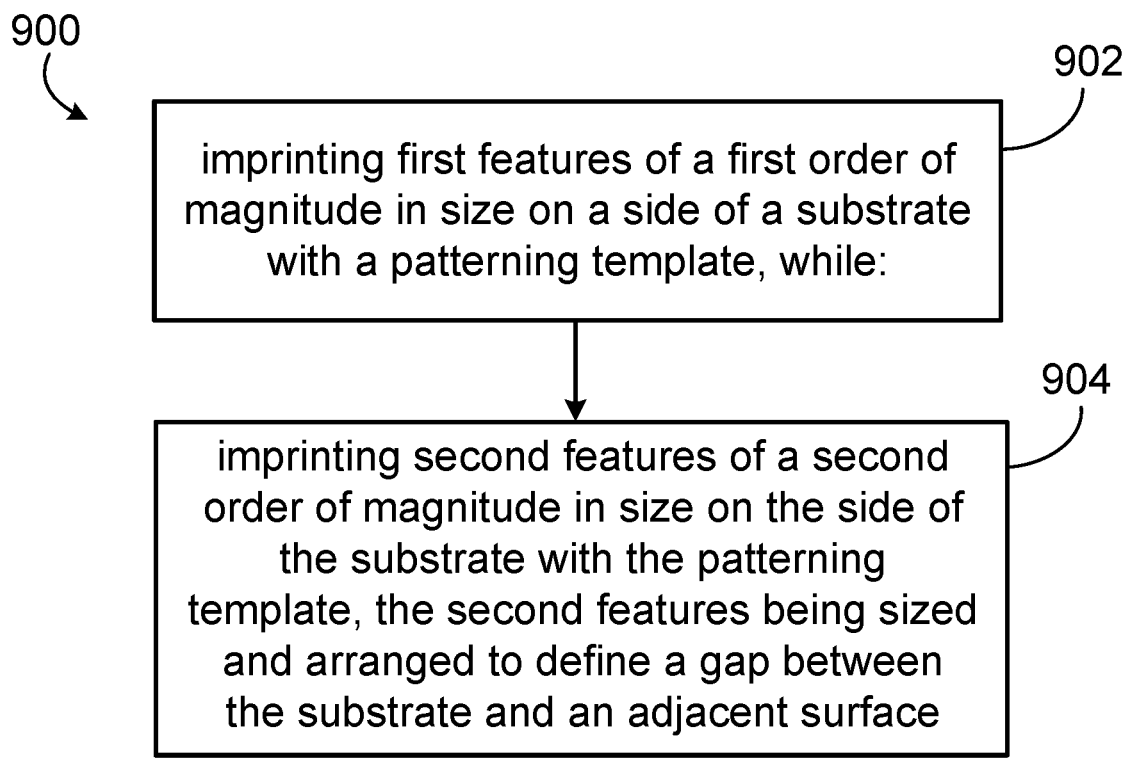
FIG. 14 is a flow chart of an example process for configuring an optical layer in an imprint lithography process.

FIG. 14 displays a flow chart of an example process 900 for configuring an optical layer (e.g., the optical layer 200, 300, 400) in an imprint lithography process. First features of a first order of magnitude in size are imprinted on a first side (e.g., the upper side 208 or the lower side 214) of a substrate (e.g., the substrate 202) with a patterning template (e.g., the patterning mold 600) (902). The first features may include one or both of diffraction gratings (e.g., the diffraction gratings provided by the functional pattern 204) and anti-reflective features (e.g., the anti-reflective features provided by the auxiliary patterns 206, 306, 406). Second features of a second order of magnitude in size are imprinted on the first side of the substrate with the patterning template while the first features are imprinted on the first side of the substrate with the patterning template, where the second features are sized and arranged to define a gap (e.g., the gap 530) between the substrate and an adjacent surface (e.g., a side of an adjacent substrate) (904). The second features may include spacers (e.g., spacers provided by the auxiliary patterns 206, 306, 406). In some examples, one or both of the spacers and the anti-reflective features are imprinted along a peripheral edge (e.g., the peripheral edge 216) of the first side of the substrate. In some examples, one or both of the spacers and the anti-reflective features are imprinted along an interior region (e.g., the interior region 218) of the first side of the substrate. In some examples, the second features are imprinted on opposite sides of (e.g., around) the first features.

The second order of magnitude in size is greater than the first order of magnitude in size. In some examples, the first order of magnitude in size is of a nano-scale, and the second order of magnitude in size is of a micro-scale. In some embodiments, the process further includes imprinting third features of the first order of magnitude in size on a second side (e.g., the upper side 208 or the lower side 214) of the substrate. The third features may include diffraction gratings or anti-reflective features.

In some embodiments, the process further includes creating the patterning template from a predecessor mold (e.g., the predecessor mold 642). In some embodiments, the process further includes forming deep features (e.g., the deep features 646) of the second order of magnitude in size in the predecessor mold. In some embodiments, the process further includes forming shallow features (e.g., the shallow features 644) of the first order of magnitude in size in the predecessor mold.

In some examples, the substrate is a first substrate, and the adjacent surface is defined by a second substrate. In some embodiments, the process further includes aligning the first and second substrates with each other. In some embodiments, the process further includes dispensing an adhesive substance (e.g., a drop of glue) atop the second features imprinted on the first side of the first substrate. In some embodiments, the process further includes attaching the first and second substrates to each other at the adhesive substance atop the second features imprinted on the first side of the first substrate to form a multi-layer optical device (e.g., the optical device 500). In some embodiments, the process further includes attaching the first and second substrates to each other at the adhesive substance atop the second features imprinted on the first side of the first substrate to form the gap between the first substrate and the adjacent surface defined by the second substrate. In some embodiments, the process further includes defining a layer of air between the first and second substrates with a thickness that is determined by heights of the second features such that the multi-layer optical device has alternating indexes of refraction.

Advantageously, the process 600 can be used to imprint a multi-functional (e.g., any of functional, anti-reflective, and spacing) 3D structure in a single step (e.g., via a single patterning mold) at ambient conditions (e.g., at an ambient temperature and at an ambient pressure) that reduces a complexity, a duration, and a cost associated with imprinting such 3D structures as compared to producing the 3D structures according to other processes. For example, conventionally formed anti-reflective patterns are deposited under vacuum and can be relatively costly, with spacer components being added in a separate, subsequent process that may include imprinting of large spacer structures, dispensing of microspheres, or dispensing of curable resist material. Additional time and complexity is associated with cleaning and treating the anti-reflective pattern prior to performing such a second processing step.

While a number of embodiments have been described for illustration purposes, the foregoing description is not intended to limit the scope of the invention, which is defined by the scope of the appended claims. There are and will be other examples, modifications, and combinations within the scope of the following claims.

What is claimed is:

1. A multilayer wearable eyepiece, comprising:
   a substrate; and
   a first waveguide on a side of the substrate, the first waveguide comprising:
   a functional pattern, wherein the functional pattern comprises first features of a first size range at first locations;
   wherein the first features comprise first diffraction gratings configured to project light of a first wavelength range and to focus a virtual image at a first depth plane, wherein the first diffraction gratings comprise a first incoupling grating and form a first orthogonal pupil expander region and a first exit pupil expander region;
   an auxiliary pattern surrounding the functional pattern, the auxiliary pattern comprising:
   additional first features of the first size range, wherein the additional first features comprise anti-reflective features; and
   second features of a second size range respectively at second locations spaced laterally apart from the first locations on the side of the substrate, the second size range being at least an order of magnitude greater in size than the first size range; and
   a second waveguide attached to the first waveguide along the second features to define a gap of the second size range between the first waveguide and the second waveguide, the second waveguide comprising second diffraction gratings configured to project light of a second wavelength range and to focus the virtual image at a second depth plane, wherein the second diffraction gratings comprise a second incoupling grating and form a second orthogonal pupil expander region and a second exit pupil expander region.

2. The multilayer wearable eyepiece of claim 1, wherein the second features comprise spacers on the side of the substrate.

3. The multilayer wearable eyepiece of claim 2, wherein the spacers, the anti-reflective features, or both are located on a peripheral edge of the side of the substrate.

4. The multilayer wearable eyepiece of claim 2, wherein the spacers, the anti-reflective features, or both are located on an interior region of the side of the substrate.

5. The multilayer wearable eyepiece of claim 1, wherein the side of the substrate is a first side of the substrate, and third features of the first size range are located on a second side of the substrate.

6. The multilayer wearable eyepiece of claim 5, wherein the third features comprise diffraction gratings or anti-reflective features located on the second side of the substrate.

7. The multilayer wearable eyepiece of claim 1, wherein the second size range comprises a range of about 1 μm to about 50 μm in height, about 1 μm to about 100 μm in width, or both.

8. The multilayer wearable eyepiece of claim 1, wherein the first size range comprises a range of up to about 300 nm in height.

9. The multilayer wearable eyepiece of claim 1, wherein the second features are located on opposite lateral sides of the first features.

10. The multilayer wearable eyepiece of claim 1, further comprising an adhesive substance atop the second features on the side of the substrate.

11. The multilayer wearable eyepiece of claim 10, wherein the first and second waveguides are attached to each other at the adhesive substance atop the second features on the side of the substrate to form the gap between the first waveguide and the second waveguide.

12. The multilayer wearable eyepiece of claim 1, wherein the first waveguide and the second waveguide are aligned with each other.

13. The multilayer wearable eyepiece of claim 1, wherein the gap provides a low index region.

14. The multilayer wearable eyepiece of claim 11, wherein the low index region comprises air with an index of refraction of 1.

15. The multilayer wearable eyepiece of claim 1, wherein each of the second features is spaced laterally apart by at least about 5 μm to about 100 μm from each of the first features.

16. The multilayer wearable eyepiece of claim 1, wherein the first and second waveguides are attached to each other with a seal along first and second peripheral edges of the first and second waveguides.

17. The multilayer wearable eyepiece of claim 1, wherein at least one of the first wavelength range and the second wavelength range corresponds to red light with wavelengths in a range of about 560 nm to about 640 nm, green light with wavelengths in a range of about 490 nm to about 570 nm, or blue light with wavelengths in a range of about 390 nm to about 470 nm.

18. The multilayer wearable eyepiece of claim 1, wherein the first depth plane and the second depth plane are the same.

19. The multilayer wearable eyepiece of claim 1, wherein the second features are spaced laterally apart from the additional first features on the side of the substrate.

20. The multilayer wearable eyepiece of claim 19, wherein the second features are located about 5 μm to about 100 μm from the additional first features.

* * * * *